(12) United States Patent
Sun et al.

(10) Patent No.: US 8,263,860 B2
(45) Date of Patent: Sep. 11, 2012

(54) SILICON PHOTOVOLTAIC DEVICE WITH CARBON NANOTUBE CABLE ELECTRODE

(75) Inventors: Hai-Lin Sun, Beijing (CN); Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 349 days.

(21) Appl. No.: 12/339,370

(22) Filed: Dec. 19, 2008

(65) Prior Publication Data

US 2009/0250114 A1 Oct. 8, 2009

(30) Foreign Application Priority Data

Apr. 3, 2008 (CN) .......................... 2008 1 0066504

(51) Int. Cl.
H01L 31/00 (2006.01)
(52) U.S. Cl. .................... 136/261; 136/255; 136/256
(58) Field of Classification Search .................. 136/255, 136/261
See application file for complete search history.

(56) References Cited

U.S. PATENT DOCUMENTS

| | | | | |
|---|---|---|---|---|
| 5,100,478 A | * | 3/1992 | Kawabata | 136/249 |
| 5,258,077 A | * | 11/1993 | Shahryar | 136/256 |
| 7,691,533 B2 | | 4/2010 | Sano et al. | |
| 7,704,480 B2 | | 4/2010 | Jiang et al. | |
| 2002/0130605 A1 | | 9/2002 | Mueller et al. | |
| 2004/0028875 A1 | | 2/2004 | Van Rijn et al. | |
| 2004/0074531 A1 | | 4/2004 | Matsui et al. | |
| 2004/0123897 A1 | | 7/2004 | Ojima et al. | |
| 2004/0177878 A1 | | 9/2004 | Maruyama | |
| 2005/0098204 A1 | | 5/2005 | Roscheisen et al. | |
| 2005/0268963 A1 | | 12/2005 | Jordan et al. | |
| 2006/0055392 A1 | | 3/2006 | Passmore et al. | |
| 2006/0062944 A1 | | 3/2006 | Gardner et al. | |
| 2006/0067871 A1 | | 3/2006 | Hart et al. | |
| 2007/0006914 A1 | | 1/2007 | Lee | |
| 2007/0026645 A1 | | 2/2007 | Lieber et al. | |
| 2007/0119496 A1 | | 5/2007 | Baldo et al. | |
| 2007/0153362 A1 | | 7/2007 | Gruner | |

(Continued)

FOREIGN PATENT DOCUMENTS

CN 1933210 3/2007

(Continued)

OTHER PUBLICATIONS

Cheng et al, "Bulk morphology and diameter distribution of single-walled carbon nanotubes synthesized by catalytic decomposition of hydrocarbons", Jun. 19, 1998, Chemical Physics Letters, 289 pp. 602-610.*

(Continued)

*Primary Examiner* — Basia Ridley
*Assistant Examiner* — Andrew Golden
(74) *Attorney, Agent, or Firm* — Altis Law Group, Inc.

(57) ABSTRACT

A photovoltaic device includes a silicon substrate, a doped silicon layer, a first electrode and a second electrode. The silicon substrate has a plurality of cavities defined therein. The doped silicon layer is formed in contact the silicon substrate. The first electrode including a plurality of carbon nanotube cables is adjacent to the silicon substrate. The second electrode is attached to the silicon substrate.

18 Claims, 5 Drawing Sheets

U.S. PATENT DOCUMENTS

| | | | |
|---|---|---|---|
| 2007/0240757 A1 | 10/2007 | Ren et al. |
| 2007/0256728 A1 | 11/2007 | Cousins |
| 2007/0273264 A1 | 11/2007 | Choi et al. |
| 2007/0277874 A1 | 12/2007 | Dawson-Elli et al. |
| 2007/0284987 A1 | 12/2007 | Liu et al. |
| 2008/0066802 A1 | 3/2008 | Reddy |
| 2008/0211101 A1 | 9/2008 | Han et al. |

FOREIGN PATENT DOCUMENTS

| | | |
|---|---|---|
| CN | 1937258 | 3/2007 |
| CN | 1996620 | 7/2007 |
| JP | S57-130483 | 8/1982 |
| JP | S59-23570 | 2/1984 |
| JP | H05-21821 | 1/1993 |
| JP | H05-243594 | 9/1993 |
| JP | H05-335614 | 12/1993 |
| JP | H06-77511 | 3/1994 |
| JP | H11-103080 | 4/1999 |
| JP | 2002-520818 | 7/2002 |
| JP | 2003-179241 | 6/2003 |
| JP | 2003-209270 | 7/2003 |
| JP | 2004-64028 | 2/2004 |
| JP | 2005-327965 | 11/2005 |
| JP | 2006-171336 | 6/2006 |
| JP | 2006-210780 | 8/2006 |
| JP | 2007-96136 | 4/2007 |
| JP | 2007-115806 | 5/2007 |
| JP | 2007-126338 | 5/2007 |
| JP | 2007161563 | 6/2007 |
| JP | 2007161576 | 6/2007 |
| JP | 2009-117463 | 5/2009 |
| TW | 200511632 | 3/2005 |
| TW | 200520243 | 6/2005 |
| TW | 200629581 | 8/2006 |
| TW | 200703698 | 1/2007 |
| TW | 319521 | 9/2007 |
| TW | 200738553 | 10/2007 |
| TW | 200800798 | 1/2008 |
| WO | WO2004068548 | 8/2004 |
| WO | WO2007015710 | 2/2007 |
| WO | WO2007-037343 | 4/2007 |

OTHER PUBLICATIONS

Somani et al., Application of metal nanoparticles decorated carbon nanotubes in photovoltaics, Applied Physics Letters, Jul. 25, 2008, vol. 93, No. 3, pp. 033315.

Wei et al., Double-Walled Carbon Nanotube Solar Cells, NANO Letters, Jul. 3, 2007, vol. 7, No. 8, pp. 2317-2321.

Pillai et al., Surface Plasmon enhanced silicon solar cells, Journal of Applied Physics, May 7, 2007, vol. 101, No. 9, pp. 093105-1-093105-8.

Liu et al., Controlled growth of super-aligned carbon nanotube arrays for spinning continuous unidirectional sheets with tunable physical properties, NANO Letters vol. 8, No. 2, 700-705(2008).

Jiang et al. "Spinning continuous carbon nanotube yarns" Oct. 24, 2002, Nature, vol. 419, p. 801.

Contreras et al. "Replacement of Transparent Conductive Oxides by Single-Wall Carbon Nanotubes in Cu(In,Ga)Se2-Based Solar Cells" The Journal of Physical Chemistry C Letters, 2007, 06, 09, vol. 111, p. 14045-14048.

Wu et al. "Transparent, Conductive Carbon Nanotube Films" Science, 2004, 08, 27, vol. 305, No. 5688, p. 1273-1276.

\* cited by examiner

US 8,263,860 B2

SILICON PHOTOVOLTAIC DEVICE WITH CARBON NANOTUBE CABLE ELECTRODE

BACKGROUND

1. Technical Field

The invention relates to energy conversion devices, and particularly to a photovoltaic device.

2. Description of Related Art

Currently, solar energy is considered a renewable and clean energy source, and can also be used as an alternative source of energy other than fossil fuel. Solar energy is generally produced by photovoltaic cells, also known as solar cells. The photovoltaic cell or the solar cell is a device that converts light into electrical energy using the photoelectric effect.

Generally, the solar cell includes a large-area p-n junction made from silicon. Silicon employed in the solar cell can be single crystal silicon or polycrystalline silicon. Referring to FIG. 5, a conventional solar cell 30 according to the prior art generally includes a silicon substrate 32, a doped silicon layer 34, a front electrode 36, and a rear electrode 38. The doped silicon layer 34 is formed in intimate contact with the silicon substrate 32 to form a p-n junction. The front electrode 36 is disposed on and electrically connected to the doped silicon layer 34. The rear electrode 38 is disposed on and electrically connected to, e.g. via ohmic contact, the silicon substrate 32. In use, the electrodes 36, 38 are connected to an external load. Current will be generated and flow in one direction across the p-n junction by the action of the electric field if light strikes the solar cell 30.

Generally, the electrodes 36, 38 are made of conductive metals, such as aluminum (Al), silver (Ag) or copper (Cu), which are usually not transparent to light. Therefore, the electrode 36, 38, in particular, the front electrode 36 is fabricated in a finger-shape or a comb-shape to increase amount of incoming light that can pass by the electrode. Moreover, in order to enhance photoelectric conversion efficiency, transparent conductive material, e.g. indium tin oxide (ITO), may instead be selected to form the front electrode 36. However, ITO material has drawbacks of, for example, being not chemically and mechanically durable, and having uneven distribution of resistance. As a result, the durability and the photoelectric conversion efficiency are relatively low for devices using transparent conductive materials.

What is needed, therefore, is a photovoltaic device that more efficient and durable is desired.

BRIEF DESCRIPTION OF THE DRAWINGS

The components in the drawing are not necessarily drawn to scale, the emphasis instead being placed upon clearly illustrating the principles of the present invention.

Figure 1:
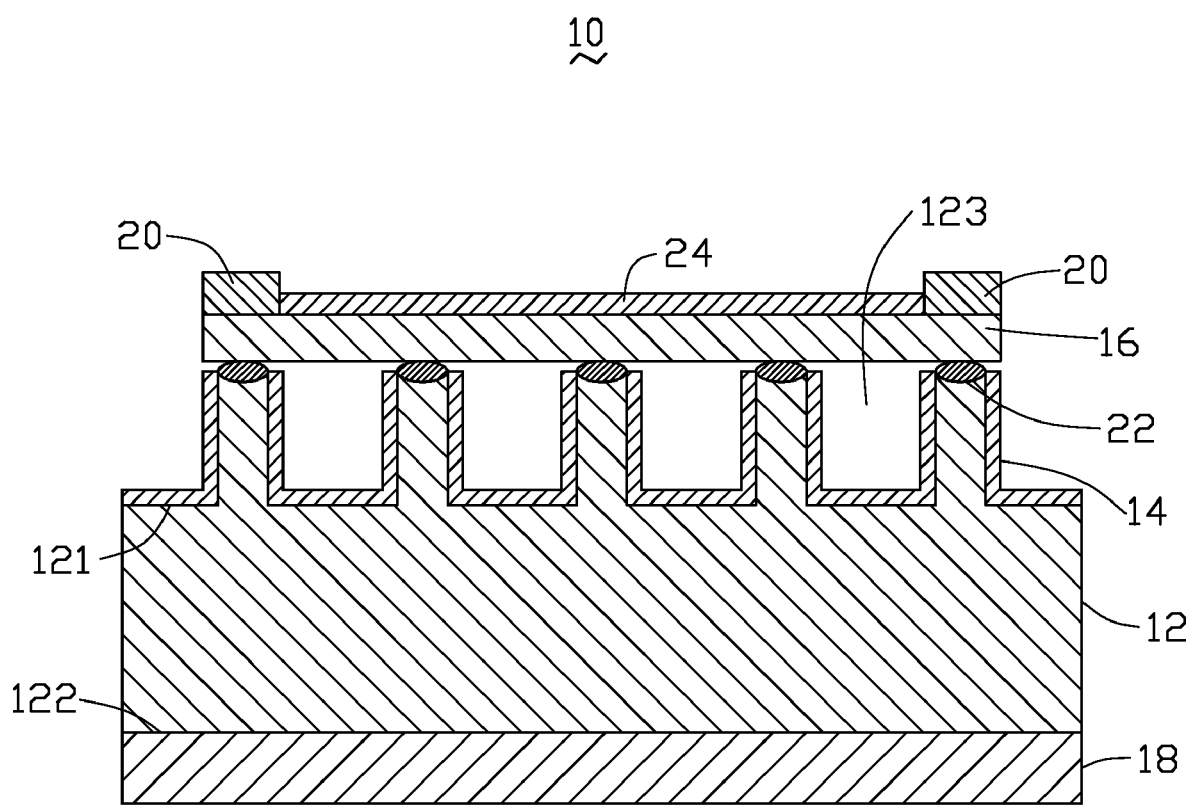
FIG. 1 is a schematic lateral view showing a photovoltaic device in accordance with an exemplary embodiment.

Corresponding reference characters indicate corresponding parts throughout the drawings. The exemplifications set out herein illustrate at least one embodiment of the present photovoltaic device, in one form, and such exemplifications are not to be construed as limiting the scope of the disclosure in any manner.

DETAILED DESCRIPTION OF THE EMBODIMENT

Reference will now be made to the drawings to describe embodiments of the present photovoltaic device in detail.

Referring to FIG. 1, a photovoltaic device 10 according to an exemplary embodiment, is shown. The photovoltaic device 10 includes a silicon substrate 12, a doped silicon layer 14, a first electrode 16, and a second electrode 18.

The silicon substrate 12 is made of single crystal silicon. Particularly, the silicon substrate 12 is p-type single crystal silicon. In addition, a thickness of the silicon substrate 12 is in an approximate range from 200 µm to 300 µm. The silicon substrate 12 has a front surface 121 and a rear surface 122, as shown in FIG. 1. The front surface 121 of the silicon substrate 12 has a plurality of cavities 123 defined therein. That is, some portions of the front surface 121 form the cavities 123 for enhancing light collation and increasing the area of p-n junction formation. The cavities 123 are distributed evenly and are spaced from each other by a distance in an approximate range from 10 µm to 30 µm. In addition, a depth of each of the cavities 123 is in an approximate range from 50 µm to 70 µm. However, in other embodiment, the cavities 123 may vary in shape and dimension. While a squared cross section is shown, any concave surface can be used. For example, the cross section of each of the cavities 123 can be square, trapezoidal, triangular, circular or other shapes. In the present embodiment, the cavities 123 are equidistantly spaced about 20 µm apart and each cavity 123 has a depth of about 60 µm. The cross sections of cavities 123 are square-shaped.

The doped silicon layer 14 is formed in contact the silicon substrate 12 to form a p-n junction between the doped silicon layer 14 and the silicon substrate 12. Namely, the doped silicon layer 14 is disposed on the front surface 121 of the silicon substrate 12 and, in particular, is disposed on inside walls of each cavity 123. In the exemplary embodiment, the doped silicon layer 14 is n-type silicon made by adding an abundance of dopant, such as phosphorus (P) or arsenic (As), into the silicon substrate 12. In addition, a thickness of the doped silicon layer 14 is in an approximate range from 500 µm to 1 µm. Thus, a plurality of p-n junctions are formed between the n-type doped silicon layer 14 and the p-type single crystal silicon substrate 12, achieving light radiation to electrical energy conversions.

Figure 2:
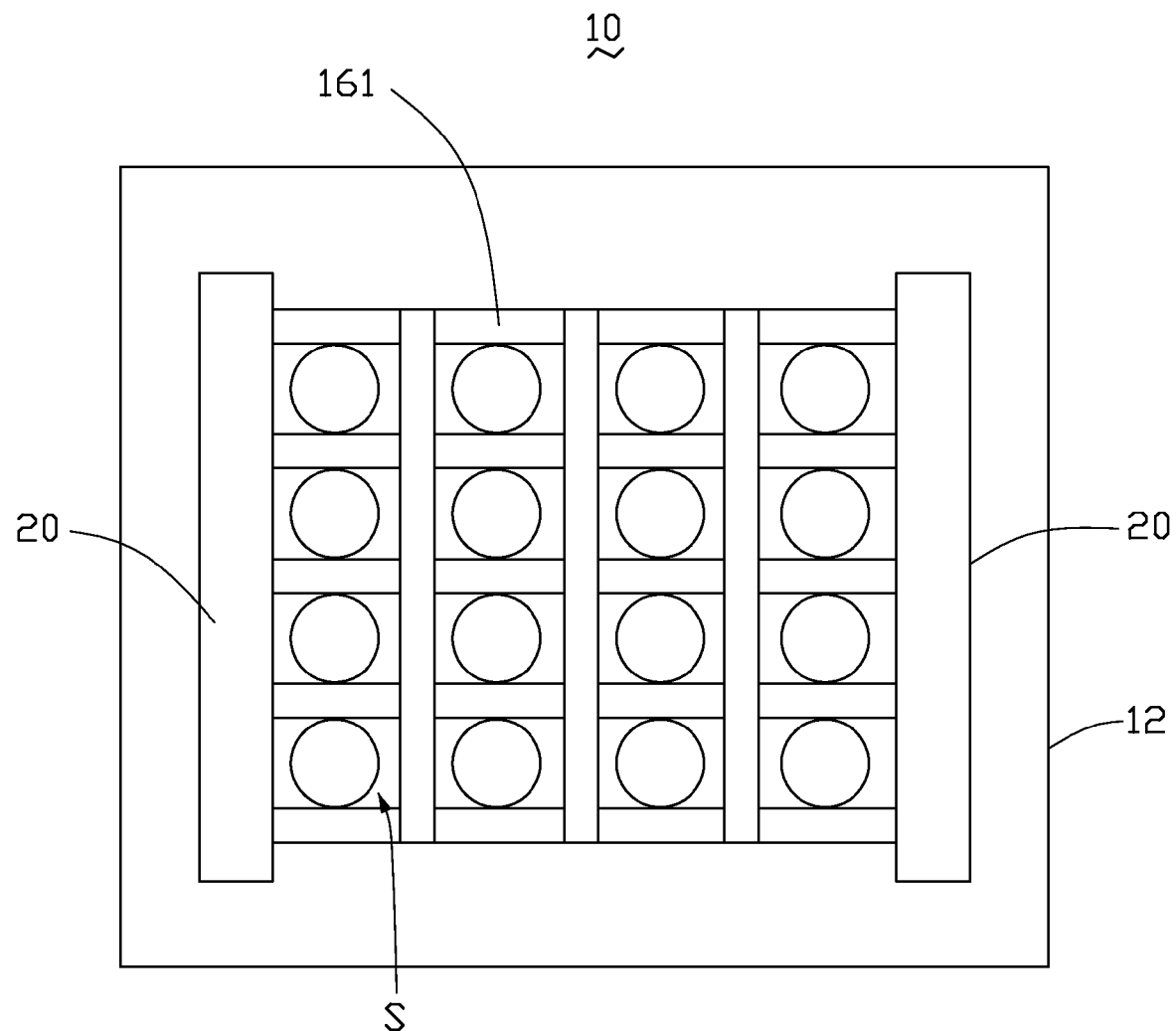
FIG. 2 is a schematic vertical view showing the photovoltaic device of FIG. 1.

The first electrode 16 is adjacent to the front surface 121 of the silicon substrate 12. The second electrode 18 is attached to the rear surface 122 of the silicon substrate 12. The second electrode 18 is made of aluminum (Al), magnesium (Mg), or silver (Ag), and has a thickness ranging from 10 µm to 300 µm. Referring to FIG. 1 and FIG. 2, the first electrode 16 includes a plurality of carbon nanotube (CNT) cables 161. The CNT cables 161 are formed by two or more CNT wires. The CNT wires are formed by CNT films/yarns. A CNT film is also a CNT yarn, and a CNT yarn is a CNT film. Either term is used to denote substantially flat carbon nanotube structure. Particularly, the CNT cables 161 are arranged to be substantially parallel to each other. The CNT cables 161 are spaced from each other by a distance ranging from 10 µm to 30 µm on the front surface 121. Suitably, the CNT cables 161 are equidistantly spaced 20 µm apart, allowing relatively greater amount of incoming light to penetrate into the silicon substrate 12. Case in this embodiment, the photovoltaic device 10 further includes a pair of third electrodes 20 electrically connected to the first electrode 16 for collecting current flowing through the first electrode 16. In the exemplary embodiment, the third electrodes 20 are spaced and disposed above the silicon substrate 12. The CNT cables 161 extend from one of the third electrodes 20 to the other of the third electrodes 20, as shown in FIG. 2.

Alternatively, referring to FIG. 2, the CNT cables 161 can form a net like structure. In the present embodiment, the CNT cables 161 are arranged to be orthogonal to each other, so that the net like structure define a plurality of spaces S. The spaces S are distributed uniformly and a dimension of each of the spaces S ranges from about 1 $nm^2$ to about 20 $\mu m^2$. Thus, the uniform net structure of CNT cables 161, proves the photovoltaic device 10 with uniform distribution of resistance. In such case, at least one portion of the CNT cables 161 is electrically connected to the third electrodes 20. Thus, the third electrodes 20 are configured to collect current flowing through the net like structure of the CNT cables 161.

Figure 3:
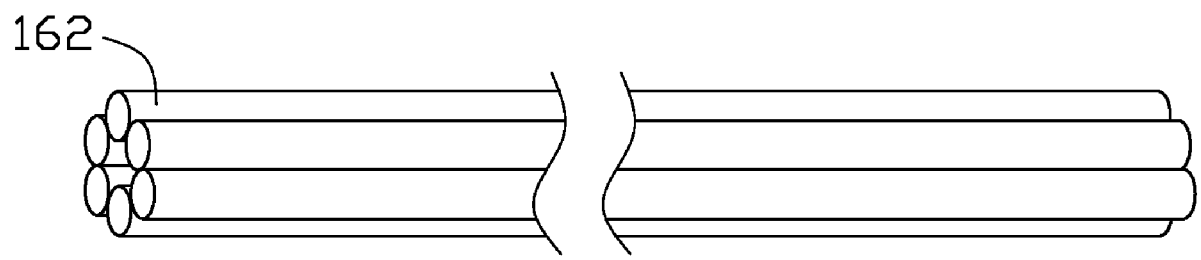
FIG. 3 is a schematic view showing a plurality of carbon nanotubes arranged in bundle form according to an exemplary embodiment.
Figure 4:
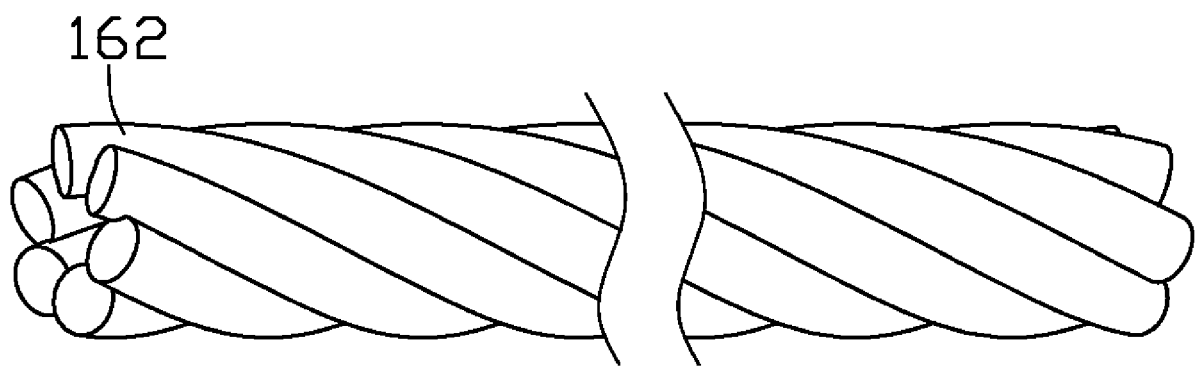
FIG. 4 is a schematic view showing a plurality of carbon nanotubes arranged in twisted form according to an exemplary embodiment.
Figure 5:
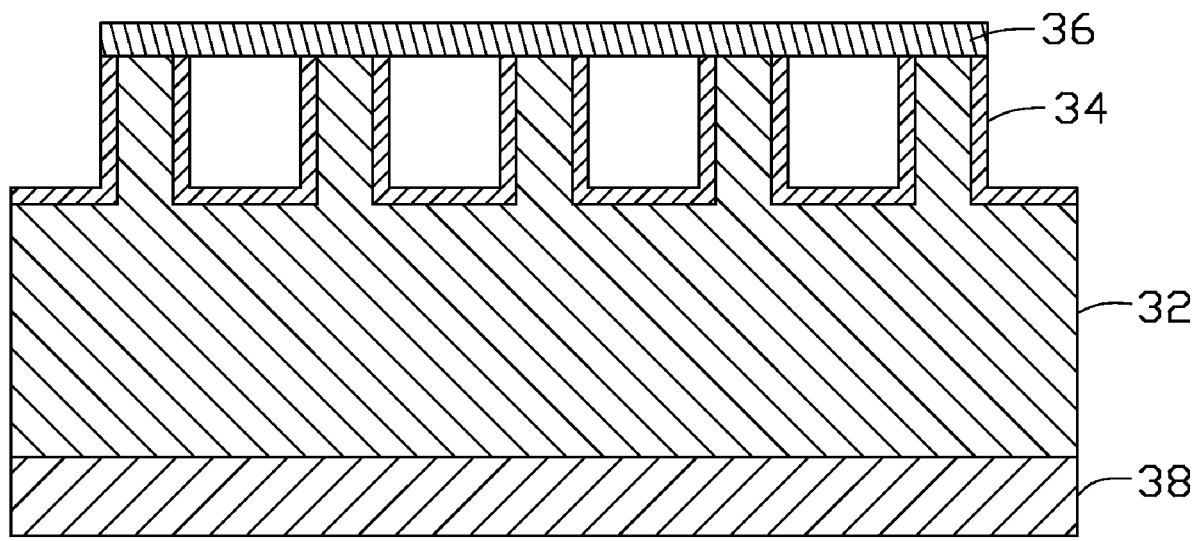
FIG. 5 is a schematic view of a conventional solar cell according to the prior art.

Referring to FIG. 3 and FIG. 4, each CNT cable 161 includes a plurality of CNT wires 162. The CNT wires 162 can be arranged in bundled structure, as shown in FIG. 3, or in twisted structure, as shown in FIG. 4. The twisted CNT wires 162 can be obtained by winding a number of CNT wires 162 via an external force. Each of the CNT cables 161 can vary in diameter and in length. For example, the diameter may be chosen by selection of the number of the CNT wires 162 used.

The CNT film includes a plurality of successively oriented CNT segments joined end-to-end by van der Waals attractive force. Furthermore, each of the CNT segments includes a plurality of CNTs with the same length. The CNTs contained in each the CNT segment can be arranged to be substantially parallel to each other.

In the present embodiment, the CNT can be selected from a group consisting of single-walled CNTs (SWCNTs), double-walled CNTs, multi-walled CNTs (MWCNTs), and combinations thereof. In such case, when the SWCNTs are employed in the first electrode 16, a diameter of each of the SWCNTs is in an approximate range from 0.5 nm to 50 nm. Alternatively, when the MWCNTs are employed in the first electrode 16, a diameter of each of the MWCNTs is in an approximate range from 1.0 nm to 50.0 nm. In the exemplary embodiment, the CNT cables 161 can be directly adhered on the front surface 121 of the silicon substrate 12 due to CNTs high purity and with large surface area.

Alternatively, the CNT cable 161 can comprise of both metal and CNTs. The metal is in the form of a wire, a powder or both wire and powder. For example, a plurality of CNT wires can be combined together and interlaced with a plurality of metal threads to form the CNT cable 161. In such case, the metal threads can be made of gold, silver, or copper. Moreover, the CNT cables 161 can be obtained by evenly mixing metal powder, such as gold, silver, or copper powder into the CNT films before treatment with solvent.

The photovoltaic device 10 of the exemplary embodiment can further include a plurality of metal strips 22 disposed between the front surface 121 of the silicon substrate 12 and the first electrode 16. The metal strips 22 including aluminum (Al) or silver (Ag) is electrically connected to the first electrode 16 and the silicon substrate 12. Due to the disposition of the metal strips 22, the conductivity between the silicon substrate 12 and the first electrode 16 is enhanced. As a result, energy conversion efficiency of the photovoltaic device 10 is improved.

Furthermore, the photovoltaic device 10 of the exemplary embodiment can further include an anti-reflection layer 24 disposed on the first electrode 16. The anti-reflection layer 24 is configured to reduce light striking on the first electrode 16 to reflect, causing the energy conversion efficiency to be enhanced. In the exemplary embodiment, the anti-reflection layer 25 is made of titanium dioxide or zinc aluminum oxide.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A photovoltaic device, comprising:
   a silicon substrate having a plurality of cavities defined therein;
   a doped silicon layer formed in contact the silicon substrate;
   a first electrode comprising a plurality of carbon nanotube cables adjacent to the silicon substrate; wherein at least some of the carbon nanotube cables are suspended above and span some of the cavities and each of the plurality of carbon nanotube cables comprises a plurality of carbon nanotube wires interlaced with a plurality of metal threads;
   a second electrode attached to the silicon substrate; and
   a pair of third electrodes, spaced from each other, disposed above the silicon substrate and electrically connected to the first electrode, wherein at least some of the plurality of carbon nanotube cables extend from one of the pair of third electrodes to another one of the pair of third electrodes.

2. The photovoltaic device as claimed in claim 1, wherein the silicon substrate comprises p-type single crystal silicon.

3. The photovoltaic device as claimed in claim 1, wherein a thickness of the silicon substrate is in an range from about 200 µm to about 300 µm.

4. The photovoltaic device as claimed in claim 1, wherein the cavities are spaced from each other by a distance in an range from about 10 µm to about 30 µm.

5. The photovoltaic device as claimed in claim 1, wherein a depth of each of the cavities is in an range from about 50 µm to about 70 µm.

6. The photovoltaic device as claimed in claim 1, wherein the doped silicon layer comprises n-type silicon.

7. The photovoltaic device as claimed in claim 1, wherein the carbon nanotube cables are substantially parallel to each other and are equidistantly spaced.

8. The photovoltaic device as claimed in claim 1, wherein the carbon nanotube cables form a net like structure.

9. The photovoltaic device as claimed in claim 8, wherein the net like structure defines spaces that range from about 1 $nm^2$ to about 20 $\mu m^2$.

10. The photovoltaic device as claimed in claim 1, wherein each of the carbon nanotube cables comprises a plurality of carbon nanotube wires.

11. The photovoltaic device as claimed in claim 10, wherein the carbon nanotube wires have a twisted or a bundle structure.

12. The photovoltaic device as claimed in claim 10, wherein each of the carbon nanotube wires comprises one or more carbon nanotube films.

13. The photovoltaic device as claimed in claim 12, wherein the one or more carbon nanotube films comprises a plurality of successively oriented carbon nanotube segments joined end-to-end by van der Waals attractive force.

14. The photovoltaic device as claimed in claim 13, wherein each of the carbon nanotube segments includes a plurality of carbon nanotubes with the same length.

15. The photovoltaic device as claimed in claim 14, wherein the carbon nanotubes are substantially parallel to each other.

16. The photovoltaic device as claimed in claim 1, further comprising metal disposed between the silicon substrate and the first electrode.

17. The photovoltaic device as claimed in claim 1, further comprising an anti-reflection layer made of titanium dioxide or zinc aluminum oxide, and disposed on the first electrode.

18. A photovoltaic device, comprising:
 a silicon substrate having a plurality of cavities defined therein;
 a doped silicon layer formed in contact the silicon substrate;
 a first electrode comprising a plurality of carbon nanotube cables adjacent to the silicon substrate; wherein each of the plurality of carbon nanotube cables comprises a plurality of carbon nanotube wires interlaced with a plurality of metal threads;
 a second electrode attached to the silicon substrate; and
 a pair of third electrodes, spaced from each other, disposed above the silicon substrate and electrically connected to the first electrode, wherein at least some of the plurality of carbon nanotube cables extend from one of the pair of third electrodes to another one of the pair of third electrodes.

* * * * *